(12) United States Patent
Shepard

(10) Patent No.: US 9,819,365 B2
(45) Date of Patent: Nov. 14, 2017

(54) INCREMENTAL ERROR DETECTION AND CORRECTION FOR MEMORIES

(71) Applicant: HGST, Inc., San Jose, CA (US)

(72) Inventor: Daniel R. Shepard, North Hampton, NH (US)

(73) Assignee: HGST, INC., San Jose, CA (US)

( * ) Notice: Subject to any disclaimer, the term of this patent is extended or adjusted under 35 U.S.C. 154(b) by 41 days.

(21) Appl. No.: 14/803,091

(22) Filed: Jul. 19, 2015

(65) Prior Publication Data
US 2016/0019112 A1    Jan. 21, 2016

Related U.S. Application Data

(60) Provisional application No. 62/026,657, filed on Jul. 20, 2014.

(51) Int. Cl.
| | | |
|---|---|---|
| *H03M 13/00* | (2006.01) | |
| *H03M 13/29* | (2006.01) | |
| *G11C 29/04* | (2006.01) | |
| *H03M 13/11* | (2006.01) | |
| *H03M 13/15* | (2006.01) | |
| *H03M 13/19* | (2006.01) | |

(52) U.S. Cl.
CPC ..... *H03M 13/611* (2013.01); *H03M 13/2909* (2013.01); *G11C 2029/0411* (2013.01); *H03M 13/1102* (2013.01); *H03M 13/1515* (2013.01); *H03M 13/19* (2013.01)

(58) Field of Classification Search
CPC .. G06F 11/1068; G11C 29/52; H03M 13/353; H03M 13/35; H03M 13/611; H03M 13/2909; H03M 13/1102
See application file for complete search history.

(56) References Cited

U.S. PATENT DOCUMENTS

| | | | | |
|---|---|---|---|---|
| 6,138,263 A * | 10/2000 | Kodama | ............ | G11B 20/1813 714/769 |
| 6,742,159 B2 * | 5/2004 | Sakurai | ................ | G06F 11/106 714/801 |
| 6,847,760 B2 * | 1/2005 | Argon | .................. | G02B 6/4202 385/24 |
| 6,918,069 B2 * | 7/2005 | Grandi | .................. | H04L 1/0047 398/27 |
| 7,555,702 B2 * | 6/2009 | Ono | ........................ | G11B 20/18 714/781 |
| 7,797,609 B2 * | 9/2010 | Neuman | .................. | G06F 11/10 714/718 |
| 8,286,059 B1 * | 10/2012 | Huang | ................ | H03M 13/091 714/757 |
| 8,677,216 B2 * | 3/2014 | Park | .................... | G06F 11/1044 714/764 |
| 8,898,549 B2 * | 11/2014 | Hubris | .................. | H04L 1/0009 365/185.09 |
| 9,189,329 B1 * | 11/2015 | Zhu | ..................... | G06F 11/1012 |

* cited by examiner

*Primary Examiner* — Esaw Abraham
(74) *Attorney, Agent, or Firm* — Patterson & Sheridan, LLP

(57) ABSTRACT

A device and method for incrementally updating the error detecting and correcting bits for an error corrected block of data in a cross point memory array is disclosed. When an error corrected block of data is modified, only the modified data bits and the incrementally updated error detecting and correcting bits are changed in the cross point memory device for improved performant and reduced impact to device endurance.

9 Claims, 2 Drawing Sheets

| 1 | 2 | 3 | 6 |   |   | 2 | 3 | 5 |   |   | 9 | 2 | 3 | 14 |
|---|---|---|---|---|---|---|---|---|---|---|---|---|---|----|
| 4 | 5 | 6 | 15 | → | 4 | 5 | 6 | 15 | → | 4 | 5 | 6 | 15 |
| 7 | 8 | 9 | 24 |   | 7 | 8 | 9 | 24 |   | 7 | 8 | 9 | 24 |
| 12 | 15 | 18 |   |   | 11 | 15 | 18 |   |   | 20 | 15 | 18 |

FIGURE 4

INCREMENTAL ERROR DETECTION AND CORRECTION FOR MEMORIES

CROSS-REFERENCE TO RELATED APPLICATIONS

This application claims benefit of U.S. Provisional Patent Application Ser. No. 62/026,657, filed Jul. 20, 2014, which is herein incorporated by reference.

TECHNICAL FIELD

Embodiments of the present invention relate to the structure and operation of memory arrays, and more particularly to memory arrays in which data is stored in blocks utilizing error detection and correction.

BACKGROUND

Modern electric memory devices such as flash memory devices erase data bits in parallel. As a result, to update a block of memory, the memory device portion in which the update data is to be stored is first erased and then the entire block is then written (with the updated bits or bytes) to the erased memory device portion. In addition, to improve the yield and lower the cost of large capacity memory devices, error detecting and error correcting bits are appended to the block. This approach requires that the unchanging data from the prior block is known.

New cross point memory arrays are being utilized to store data in applications that were previously served by flash memory devices. As with flash memory devices, error detecting and error correcting techniques are being used to improve yield. Because, since cross point memory arrays can be erased on a byte-wise or even a bit-wise basis (as opposed to the bulk erase requirements of flash memory devices), and because each time a memory cell is written its ability to be written again degrades (a property called endurance), it is desirable to only change those bits or bytes that have changed. New cross point memory arrays that use phase-change information storage elements such as those found in PCM or PRAM devices (or, in some cases, resistive change information storage elements such as those found in RRAM devices) that wear out much more slowly than charge storage information storage elements (such as floating gate devices such as those found in flash memory devices) will particularly benefit from the present invention due to the reduced load balancing that enables the same physical storage locations to be written and rewritten without relocating the sector to a different area of the memory device.

What is needed is an error correcting technique that can be made more efficient by adjusting the error correcting bits from a previous computation of the error detecting and correcting bits for a storage block rather than regenerating the error detecting and correcting bits for the entire block. What is needed is a cross point memory array that works with an incrementally modifiable ECC. The present invention fills this need by reversing the error correcting code (ECC) and backing out prior values and replacing them with new values without recomputing the entire ECC.

BRIEF DESCRIPTION OF THE DRAWINGS

In the following description, various embodiments of the present invention are described with reference to the following drawings, in which:

FIG. 1 depicts a nine number block of data arranged in a rectangular pattern;

FIG. 2 depicts a nine number block of data arranged in a rectangular pattern with computed error detection and correction codes added;

FIG. 3 depicts a nine number block of data arranged in a rectangular pattern with an error in the first number; and FIG. 4 illustrates a nine number block of data arranged in a rectangular pattern for which the first number is being changed.

DESCRIPTION OF THE PREFERRED EMBODIMENT

Modern electric memory devices such as flash memory devices erase data bits in parallel. As a result, to update a block of memory, the memory device portion in which the update data is to be stored is first erased and then the entire block is written (with the updated bits or bytes) to the erased memory device portion. In addition, to improve the yield and lower the cost of large capacity memory devices, error detecting and error correcting bits are appended to the block. Often, this involves reading the existing portion out of the flash memory into a buffer area, replacing bytes in the buffer area with the new update data bytes, recomputing the ECC bits (in the buffer area), and rewriting the buffer area data with ECC bits to a previously erased area of the flash memory device.

New cross point memory arrays are being utilized to store data in applications that were previously served by flash memory devices. As with flash memory devices, error detecting and error correcting techniques are being used in these cross point memory array devices to improve yield. Since cross point memory arrays can be erased on a byte-wise or even a bit-wise basis (as opposed to the bulk erase requirements of flash memory devices), it is desirable to only change those bits or bytes that change. This in part because even with cross point memory array devices (but, to a lesser degree), each time a memory cell is written, its ability to be rewritten degrades (a property called endurance).

Error correcting techniques utilized with flash memory devices generate the error detecting and error correcting bits for a given block of memory. This technique can be made more efficient by adjusting the error correcting bits from a previous generation of the error detecting and correcting bits rather than regenerating the error detecting and correcting bits for the entire block.

By way of example, consider an update to the FAT table of a typical memory system. The FAT table (or File Allocation Table) is used, among other things, to hold the names of the files storage along with a pointer into the memory device for where the data storage for any given file begins. When a new file is added to the device, the file's name is added to the FAT table with a pointer to an area of available storage where the file contents are stored. With a flash memory device, the name and pointer is added to a copy of a block of the FAT table in memory, new error detecting and correcting bits are determined by an error correcting algorithm for the block, and the new block (comprising the new file information and error detecting and correcting bits) is written to an erased area of the flash memory device. This is necessitated by the fact that the flash memory cannot be piecewise erased—i.e., it is not possible to erase only the memory cells where the error correction bits will be stored because erasure is done a block at a time. While it would be possible to write the bytes being appended (i.e., those bytes being written to an area of the area of the block that has not yet been written and is still in its erased state), the ECC bits will have been written and will require erasure (i.e., the bits being changed from a '0' to a '1', if '1' is the defined erased state).

The error detection and correction algorithm can be one of many possible algorithms—from simple hamming codes and multidimensional parity-check codes to Reed-Solomon codes and Turbo codes and low-density parity-check codes (LDPC).

Consider a simple nine-number data block: 123456789. With two-dimensional parity-check code, the numbers are first arranged in a rectangular pattern as shown in FIG. 1.

Error detecting and correcting parity numbers are then calculated by summing each column and row separately as shown in FIG. 2. The fifteen number sequence "1 2 3 4 5 6 7 8 9 6 15 24 12 15 18" is the block that is stored into the memory device. If any single error occurs (say, to the first number) during writing and reading back, this error can be detected and corrected by arranging the message into its original grid (see FIG. 3). With an assumption that only one error occurred, it is possible to verify that the "2 3 4 5 6 7 8 9" are correct and it is also possible to correct the error in the first number by reversing the algorithm (6−3−2=1 and 12−7−4=1). With a flash memory, the error correcting values are computed for each block written to available flash storage.

The present invention is an improvement to this approach. Since with a cross point memory, erasure can be done to individual storage locations, changing a particular number (say, the first number) only requires changing that number and adjusting the affected error correcting codes. For the purpose of illustration and from the above example while referring to FIG. 4, changing the "1" to a "9" would be done in two steps.

First, the targeted number would be backed out of the error detecting and correcting algorithm's resulting error detecting and correcting bytes by reversing the algorithm; in the present example, since the original error detecting and correcting codes were calculated by adding each data value (the number "1" and others), reversing out the "1" dictates that we use the opposite operation (subtraction) to back out its impact (we subtract the "1" from the 6 and from the 12 the result of which is shown in the middle matrix). Second, we bring the "9" and run the forward algorithm to add in the impact of the "9" to the error detection and correction values (5+9=14 and 11+9=20). Other more advanced error detecting and correcting algorithms such as those mentioned above, while using more complex operators, would be affected in similar fashion.

An improvement to the exact technique as described above, would be to combine the two steps by calculating the difference between the new and old value (in the above example, the difference between the old '1' value and the new '9' value is the value '8') and this difference value would be incorporated into the impacted error detection and correction values (in the above example, the difference value '8' is added to the old error detection and correction values of '6' and '12' resulting in the same new error detection and correction values of '14' and '20'). More complex algorithms will be more complex in how the change will impact the error detection and correction values (more complex than the simple subtraction as outlined in the above example), but the approach is nonetheless the same as will be clear to those skilled in the art of error detection and correction algorithms.

The advantage of the present invention is that the entire block would not have to be read out of the memory (in order to make them available for recomputing all of the error correcting values from scratch) and only the values that are changed (i.e., the new data values and the affected ECC values) would have to be written into the memory. In the above example, only the prior value (of the value being replaced) and two out of six ECC values had to be read form memory; only the new value and two out of six ECC values had to be written to memory. The result is greater speed (due to fewer reads and less computation time) and less wear (due to fewer writes) on the individual memory cells. Throughput and endurance are both improved.

The foregoing description of an example of embodiments of the present invention; variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

What is claimed is:

1. A method of storing information with increased speed in an electronic cross point memory storage device having a plurality of memory cells arranged in columns and rows, comprising:
   (i) targeting data bits of a subset of the plurality of memory cells in one of the rows;
   (ii) determining error correcting values corresponding to new data bits to be written to the subset of the plurality of memory cells in the one of the rows;
   (iii) writing the new data bits to the subset of the plurality of memory cells in the one of the rows of the memory storage device; and
   (iv) writing error correcting bits corresponding to the error correcting values to the memory device;
   wherein the plurality of memory cells in the one or the rows other than the subset are unchanged.

2. The method of claim 1, wherein error correcting bits written to the memory storage device comprises only those error detecting values that have changed as a result of the writing the new data bits to the subset of the plurality of memory cells.

3. The method of claim 1, wherein the determining the error correcting values corresponding to the writing the new data bits comprises:
   (i) removing an impact to the error detecting values of the data bits; and
   (ii) incorporating an impact to the error detecting values of the new data bits.

4. The method of claim 1, wherein the determining the error correcting values corresponding to the writing the new data bits comprises:
   (i) determining an impact to the error detecting values of the new data bits; and
   (ii) updating the error detecting values with the determination of the impact of the new data bits.

5. The method of claim 1, wherein the error correcting values corresponding to the new data bits are determined for each row and each column of the memory cells in which the new data bits reside.

6. A memory storage device with increased speed comprising a cross point memory array having a plurality of memory cells arranged in columns and rows, the memory storage device operable to perform a method comprising:
   (i) targeting data bits of a subset of the plurality of memory cells in one of the columns;

(ii) determining error correcting values corresponding to new data bits to be written to the subset of the plurality of memory cells in the one of the columns;

(iii) writing the new data bits to the subset of the plurality of memory cells in the one of the columns of the memory storage device; and (iv) writing error correcting bits corresponding to the error correcting values to the memory storage device;

wherein the plurality of memory cells in the one of the columns other than the subset are unchanged.

7. The memory storage device of claim 6, wherein in error correcting bits written to the memory storage device comprises only those error detecting values that have changed as a result of the writing the new data bits to the subset of the plurality of memory cells.

8. The memory storage device of claim 6, wherein the determining the error correcting values corresponding to the writing the new data bits comprises:

(i) removing an impact to the error detecting values of the data bits; and (ii) incorporating an impact to the error detecting values of the new data bits.

9. The memory storage device of claim 6, wherein the determining the error correcting values corresponding to the writing the new data bits comprises:

(i) determining an impact to the error detecting values of the new data bits; and (ii) updating the error detecting values with the determination of the impact of the new data bits.

\* \* \* \* \*